United States Patent
Chang et al.

(10) Patent No.: US 8,073,417 B2
(45) Date of Patent: Dec. 6, 2011

(54) METHOD AND SYSTEM FOR A TRANSFORMER-BASED HIGH PERFORMANCE CROSS-COUPLED LOW NOISE AMPLIFIER

(75) Inventors: Yuyu Chang, Irvine, CA (US); Arya Behzad, Poway, CA (US)

(73) Assignee: Broadcom Corporation, Irvine, CA (US)

( * ) Notice: Subject to any disclaimer, the term of this patent is extended or adjusted under 35 U.S.C. 154(b) by 919 days.

(21) Appl. No.: 11/618,835

(22) Filed: Dec. 31, 2006

(65) Prior Publication Data
US 2008/0139158 A1   Jun. 12, 2008

Related U.S. Application Data

(60) Provisional application No. 60/868,818, filed on Dec. 6, 2006.

(51) Int. Cl.
 *H04B 1/18* (2006.01)
 *H04B 1/28* (2006.01)
 *H04B 7/00* (2006.01)
(52) U.S. Cl. ............ 455/280; 455/279.1; 455/292; 455/333
(58) Field of Classification Search ........... 455/279.1, 455/286, 292, 296, 311, 323, 333, 341
 See application file for complete search history.

(56) References Cited

U.S. PATENT DOCUMENTS

| | | | | |
|---|---|---|---|---|
| 6,809,581 B2* | 10/2004 | Rofougaran et al. | ........ | 327/563 |
| 7,081,796 B2* | 7/2006 | Krone | ........ | 330/254 |
| 7,139,547 B2* | 11/2006 | Wakayama et al. | ........ | 455/333 |
| 7,269,391 B2* | 9/2007 | Chiu et al. | ........ | 455/83 |
| 7,286,811 B2* | 10/2007 | Kral | ........ | 455/333 |
| 7,299,021 B2* | 11/2007 | Pärssinen et al. | ........ | 455/226.1 |
| 7,389,091 B2* | 6/2008 | Tanaka | ........ | 455/126 |
| 2003/0114129 A1* | 6/2003 | Jerng | ........ | 455/323 |
| 2007/0066271 A1* | 3/2007 | Vavelidis et al. | ........ | 455/333 |
| 2007/0188238 A1* | 8/2007 | Su et al. | ........ | 330/301 |
| 2007/0243845 A1* | 10/2007 | Shin | ........ | 455/292 |

* cited by examiner

*Primary Examiner* — Simon Nguyen
(74) *Attorney, Agent, or Firm* — Thomas, Kayden Horstemeyer & Risley, LLP

(57) ABSTRACT

Aspects of a method and system for a transformer-based high performance cross-coupled low noise amplifier may include one or more circuits that integrate within a single chip, a balun with a low-noise amplifier. A DC current biasing path for the low-noise amplifier may be provided through the integrated balun. The low-noise amplifier may be configured as a cross-coupled low-noise amplifier, where the balun may be directly coupled to the cross-coupled low-noise amplifier. The balun may comprise two or more inductors, wherein one or more of the inductors may provide an electrical path for allowing a DC bias current to flow to ground. Integrating a balun on a single chip with a low-noise amplifier may allow the use of a single received signal input terminal. The biasing voltage may be selected to optimize performance of the low-noise amplifier.

21 Claims, 4 Drawing Sheets

METHOD AND SYSTEM FOR A TRANSFORMER-BASED HIGH PERFORMANCE CROSS-COUPLED LOW NOISE AMPLIFIER

CROSS-REFERENCE TO RELATED APPLICATIONS/INCORPORATION BY REFERENCE

This application makes reference to, claims priority to, and claims the benefit of U.S. Provisional Application Ser. No. 60/868,818, filed on Dec. 6, 2006.

The above stated application is hereby incorporated herein by reference in its entirety.

FIELD OF THE INVENTION

Certain embodiments of the invention relate to electronic circuit design. More specifically, certain embodiments of the invention relate to a method and system for a transformer-based high performance cross-coupled low noise amplifier.

BACKGROUND OF THE INVENTION

Typically, radio frequency (RF) front-ends of receivers are fed from an antenna providing a single-ended input to the RF receiver chain. For many applications and purposes, however, it is useful to convert the single-ended input from the antenna to a differential signal.

A differential line is a transmission line made of two conductors that both carry a signal with reference to ground. The signals are generally designed to minimize the interference they create together by designing them in such a way that their respective electromagnetic fields cancel each other. For example, the signals may be chosen to be the inverse of each other. In addition, differential signals are robust to interference since interference that is experienced on both conductors, can be removed easily.

To convert a single-ended signal to differential signals, a balun is used, where balun is a word-construct based on bal-anced and un-balanced. Baluns are electromagnetic coupling devices in a wide variety of different possible implementations to achieve the conversion from a single-ended signal to differential signals and vice versa.

Most RF front-ends require the received antenna signal to be amplified by a low-noise amplifier. Hence, the antenna output is fed to a balun to be converted to differential signals. The differential signals are then fed to a differential low-noise amplifier. However, the use of separate discrete devices for the balun and the low-noise amplifier is consuming valuable space, and the performance of the amplifier and the balun cannot be optimized simultaneously.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and/or system for a transformer-based high performance cross-coupled low noise amplifier, substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a transformer-based high performance cross-coupled low noise amplifier (LNA). Aspects of the invention may comprise one or more circuits integrated within a single chip comprising an integrated balun and low-noise amplifier. A DC current biasing path for the low-noise amplifier may be provided through the integrated balun. The low-noise amplifier may be configured as a cross-coupled low-noise amplifier, where the balun may be directly coupled to the cross-coupled low-noise amplifier. The balun may comprise two or more inductors, wherein one or more of the inductors may provide an electrical path for allowing a DC bias current to flow to ground. Integrating a balun on a single chip with a low-noise amplifier may allow the use of a single-ended signal at the received RF input terminal. The biasing voltage may be selected to optimize performance of the low-noise amplifier.

Figure 1A:
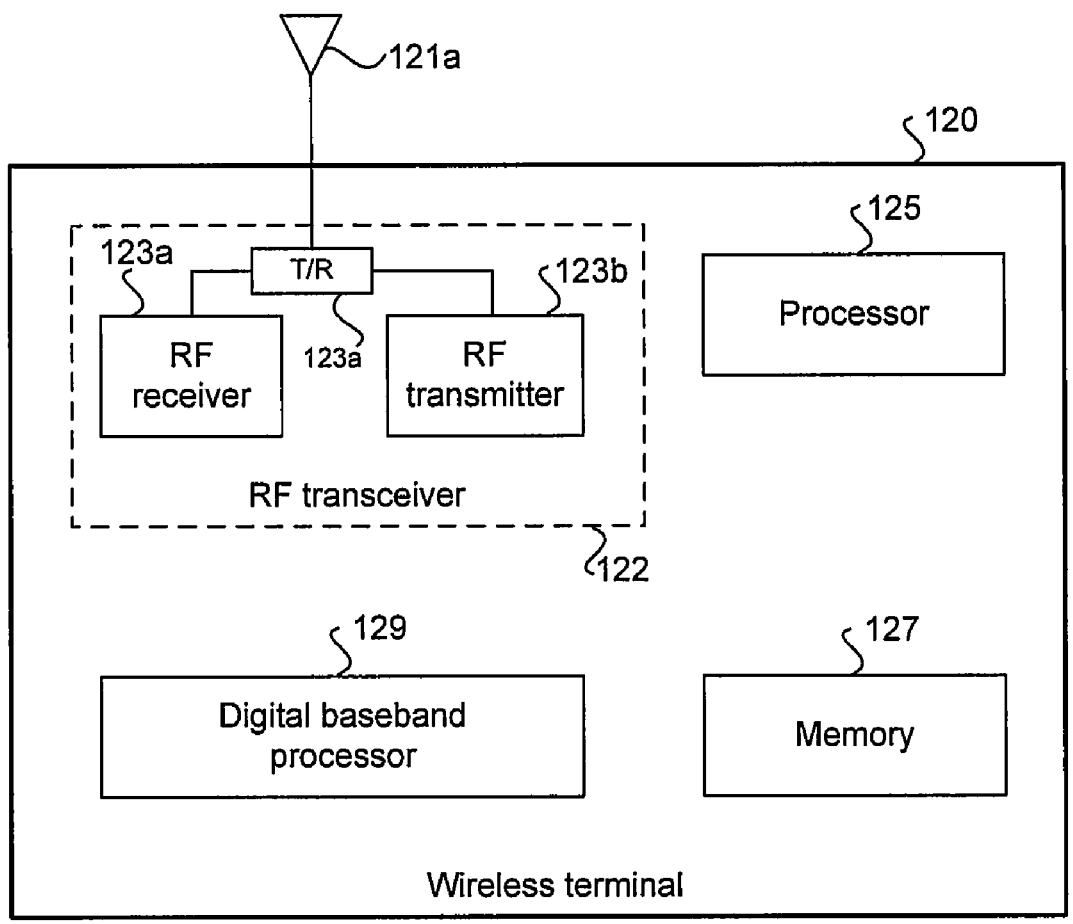
FIG. 1a is a block diagram illustrating an exemplary wireless terminal, in accordance with an embodiment of the invention.

FIG. 1a is a block diagram illustrating an exemplary wireless terminal, in accordance with an embodiment of the invention. Referring to FIG. 1a, there is shown a wireless terminal 120 that may comprise an RF receiver 123a, an RF transmitter 123b, a digital baseband processor 129, a processor 125, and a memory 127. In some embodiments of the invention, the RF receiver 123a and the RF transmitter 123b may be integrated within an RF transceiver 122, for example. A single transmit and receive antenna 121a may be communicatively coupled to the RF receiver 123a and the RF transmitter 123b. A switch or other device having switching capabilities may be coupled between the RF receiver 123a and RF transmitter 123b, and may be utilized to switch the antenna between transmit and receive functions. The wireless terminal 120 may be operated in a system, such as the Wireless Local Area Network (WLAN), a cellular network and/or digital video broadcast network, for example. In this regard, the wireless terminal 120 may support a plurality of wireless communication protocols, including the IEEE 802.11n standard specifications for WLAN networks.

The RF receiver 123a may comprise suitable logic, circuitry, and/or code that may enable processing of received RF signals. The RF receiver 123a may enable receiving RF signals in a plurality of frequency bands in accordance with the wireless communications protocols that may be supported by the wireless terminal 120. Each frequency band supported by the RF receiver 123a may have a corresponding front-end circuit for handling low noise amplification and down conversion operations, for example. In this regard, the RF receiver 123a may be referred to as a multi-band receiver when it supports more than one frequency band. In another embodiment of the invention, the wireless terminal 120 may comprise more than one RF receiver 123a, wherein each of the RF receiver 123a may be a single-band or a multi-band receiver. The RF receiver 123a may be implemented on a chip. In an embodiment of the invention, the RF receiver 123a may be integrated with the RF transmitter 123b on a chip to comprise the RF transceiver 122, for example. In another embodiment of the invention, the RF receiver 123a may be integrated on a chip with more than one component in the wireless terminal 120.

The RF receiver 123a may quadrature down convert the received RF signal to a baseband frequency signal that comprises an in-phase (I) component and a quadrature (Q) component. The RF receiver 123a may perform direct down conversion of the received RF signal to a baseband frequency signal, for example. In some instances, the RF receiver 123a may enable analog-to-digital conversion of the baseband signal components before transferring the components to the digital baseband processor 129. In other instances, the RF receiver 123a may transfer the baseband signal components in analog form.

The digital baseband processor 129 may comprise suitable logic, circuitry, and/or code that may enable processing and/or handling of baseband frequency signals. In this regard, the digital baseband processor 129 may process or handle signals received from the RF receiver 123a and/or signals to be transferred to the RF transmitter 123b, when the RF transmitter 123b is present, for transmission to the network. The digital baseband processor 129 may also provide control and/or feedback information to the RF receiver 123a and to the RF transmitter 123b based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b for transmission to the network. In an embodiment of the invention, the digital baseband processor 129 may be integrated on a chip with more than one component in the wireless terminal 120.

The RF transmitter 123b may comprise suitable logic, circuitry, and/or code that may enable processing of RF signals for transmission. The RF transmitter 123b may enable transmission of RF signals in a plurality of frequency bands. Each frequency band supported by the RF transmitter 123b may have a corresponding front-end circuit for handling amplification and up conversion operations, for example. In this regard, the RF transmitter 123b may be referred to as a multi-band transmitter when it supports more than one frequency band. In another embodiment of the invention, the wireless terminal 120 may comprise more than one RF transmitter 123b, wherein each of the RF transmitter 123b may be a single-band or a multi-band transmitter. The RF transmitter 123b may be implemented on a chip. In an embodiment of the invention, the RF transmitter 123b may be integrated with the RF receiver 123a on a chip to comprise the RF transceiver 122, for example. In another embodiment of the invention, the RF transmitter 123b may be integrated on a chip with more than one component in the wireless terminal 120.

The RF transmitter 123b may quadrature up convert the baseband frequency signal comprising I/Q components to an RF signal. The RF transmitter 123b may perform direct up conversion of the baseband frequency signal to a baseband frequency signal, for example. In some instances, the RF transmitter 123b may enable digital-to-analog conversion of the baseband signal components received from the digital baseband processor 129 before up conversion. In other instances, the RF transmitter 123b may receive baseband signal components in analog form.

The processor 125 may comprise suitable logic, circuitry, and/or code that may enable control and/or data processing operations for the wireless terminal 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the wireless terminal 120. The processor 125 may also enable executing of applications that may be utilized by the wireless terminal 120. For example, the processor 125 may generate at least one control signal and/or may execute applications that may enable current and proposed WLAN communications in the wireless terminal 120.

The memory 127 may comprise suitable logic, circuitry, and/or code that may enable storage of data and/or other information utilized by the wireless terminal 120. For example, the memory 127 may be utilized for storing processed data generated by the digital baseband processor 129 and/or the processor 125. The memory 127 may also be utilized to store information, such as configuration information, that may be utilized to control the operation of at least one block in the wireless terminal 120. For example, the memory 127 may comprise information necessary to configure the RF receiver 123a for receiving WLAN signals in the appropriate frequency band.

Figure 1B:
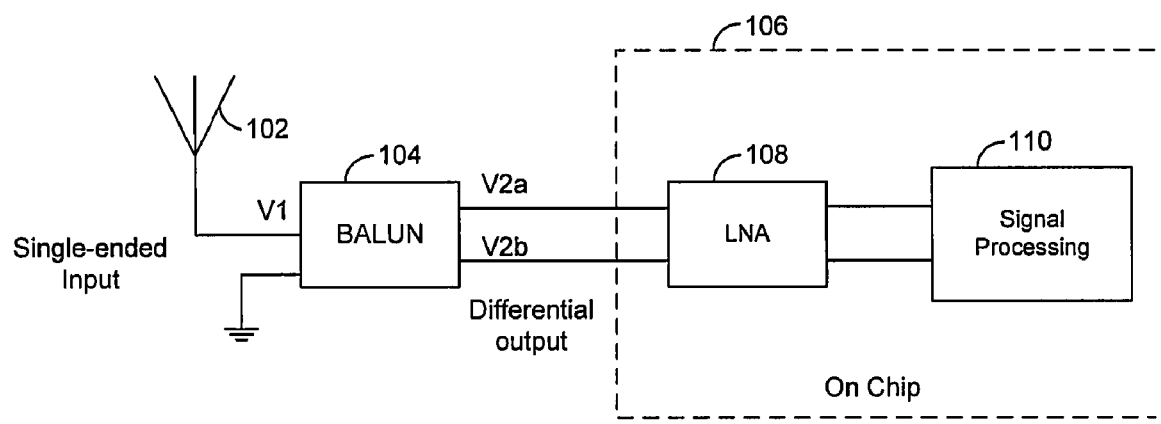
FIG. 1b is a diagram illustrating a radio frequency front-end, in connection with an embodiment of the invention.

FIG. 1b is a diagram illustrating a radio frequency front-end, in connection with an embodiment of the invention. Referring to FIG. 1b, there is shown an antenna 102, a balun 104 and a receiver block 106. The receiver block 106 may comprise a low-noise amplifier (LNA) 108 and a signal processing block 110. The signal processing block is represented symbolically and may comprise any number of components and/or circuit configurations. There is further shown in FIG. 1b, a single-ended input voltage V1 and the differential voltages V2a and V2b. The radio frequency front-end of FIG. 1b may be part of the receiver 123a, which is illustrated in FIG. 1a

An antenna 102 may receive electromagnetic signals and provide a single-ended voltage V1 at its output. Frequently, it may be desirable to convert the single-ended antenna output voltage to differential output voltages that may be the inverse of each other. Hence, V2a=−V2b. One of the advantages of differential signals is that the differential signals transmitted on two sufficiently closely spaced conductors may create opposing electromagnetic fields and hence may create less electromagnetic interference to other signals. Furthermore, if the two conductors are sufficiently close, any interference that may be picked up on one of the conductors may be the same on the other conductor. If both signals may be affected equally, the interference may be cancelled easily by addition of the two differential signals. This may be seen from the following relationship, where n(t) is an interference signal that may be picked up on the transmission lines and affects both V2a and V2b:

$$V2a(t)=x(t)+n(t)$$

$$V2b(t)=-x(t)+n(t)$$

$$V2a(t)-V2b(t)=2x(t)$$

The voltages V2a and V2b may then be further processed in a receiver block 106 that may be an integrated circuit. The differential voltages V2a and V2b may be amplified in a differential low-noise amplifier (LNA) 108 and perhaps may be further processed in a signal processing block 110.

Figure 2:
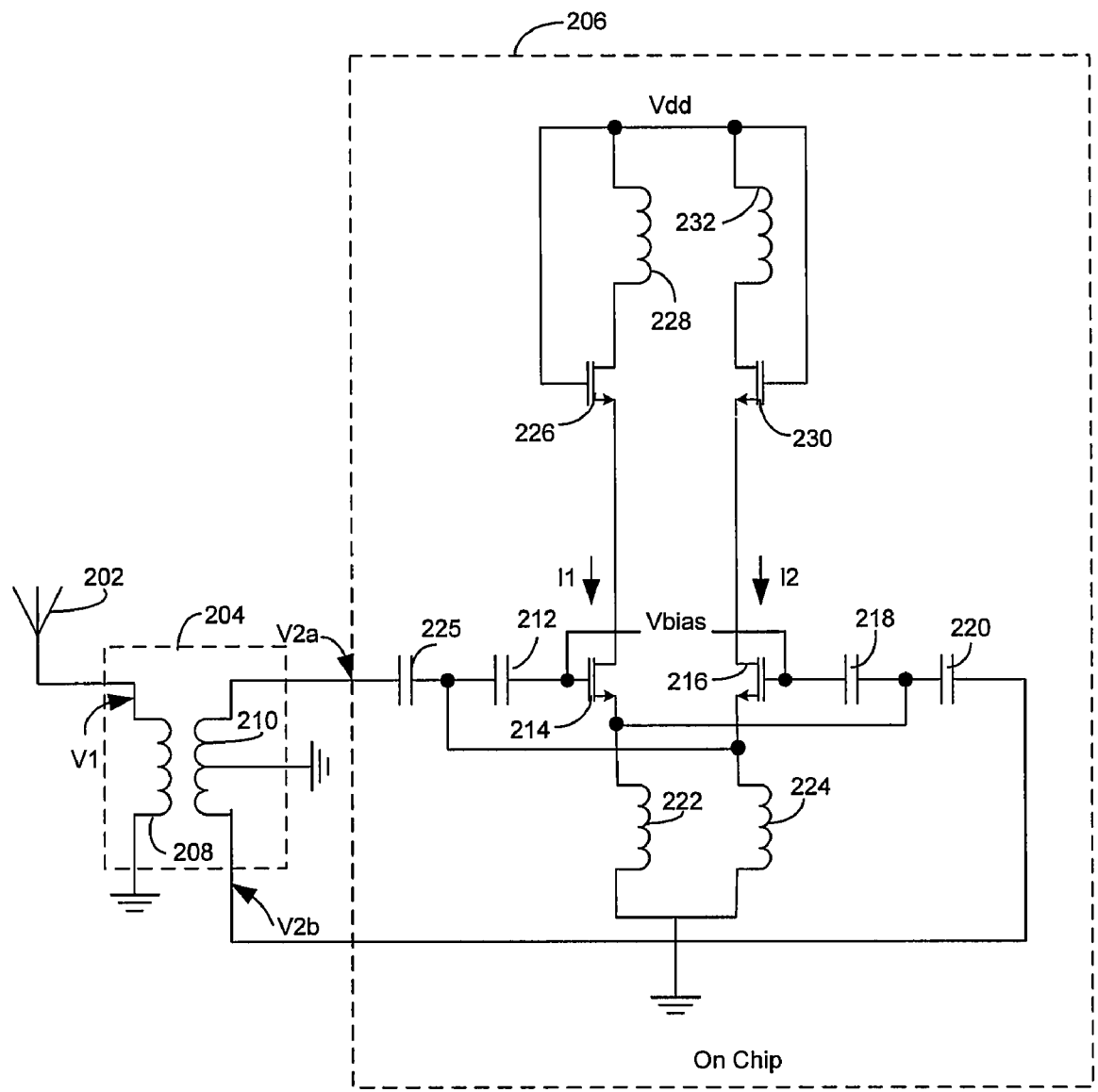
FIG. 2 is a circuit diagram illustrating an exemplary external balun and an exemplary low-noise amplifier integrated circuit, in connection with an embodiment of the invention.

FIG. 2 is a circuit diagram illustrating an exemplary external balun and an exemplary low-noise amplifier integrated circuit, in connection with an embodiment of the invention. Referring to FIG. 2, there is shown an antenna 202, a balun 204 and a LNA 206. The balun 204 may comprise inductors 208 and 210. The LNA 206 may comprise capacitors 212, 218, 220 and 225, MOSFETs 214, 216, 226 and 230, and source inductors 222, 224, 228 and 232. There is also shown in FIG. 2, voltages V2a, V2b, Vbias and Vdd and currents I1 and I2.

The balun 204 illustrates an exemplary method of converting a single-ended signal to differential signals. The voltage V1 induces a field in inductor 208. Through electromagnetic coupling from inductor 208 to inductor 210 and since the center-tap of inductor 210 may be grounded, the voltages V2a and V2b may be the inverse of each other. Vbias may be used to set the bias voltage for MOSFETs 214 and 216, thereby setting the DC operating point.

The balanced differential input voltages V2a and V2b may then be fed to the LNA 206. Vdd may be the power supply voltage. In the exemplary circuit diagram shown in FIG. 2, the on-chip LNA 206 may be a stand-alone amplifier. As such, the source inductors 222 and 224 may be required to provide a DC path to ground for the DC components of I1 and I2, the drain currents of MOSFET 214 and MOSFET 216, respectively. This may provide appropriate biasing for the MOSFETs 214 and 216, while it may also provide a high impedance to high frequency AC components of the input signals V2a and V2b.

The capacitors 212, 218, 220 and 225 may be used for AC coupling.

Figure 3:
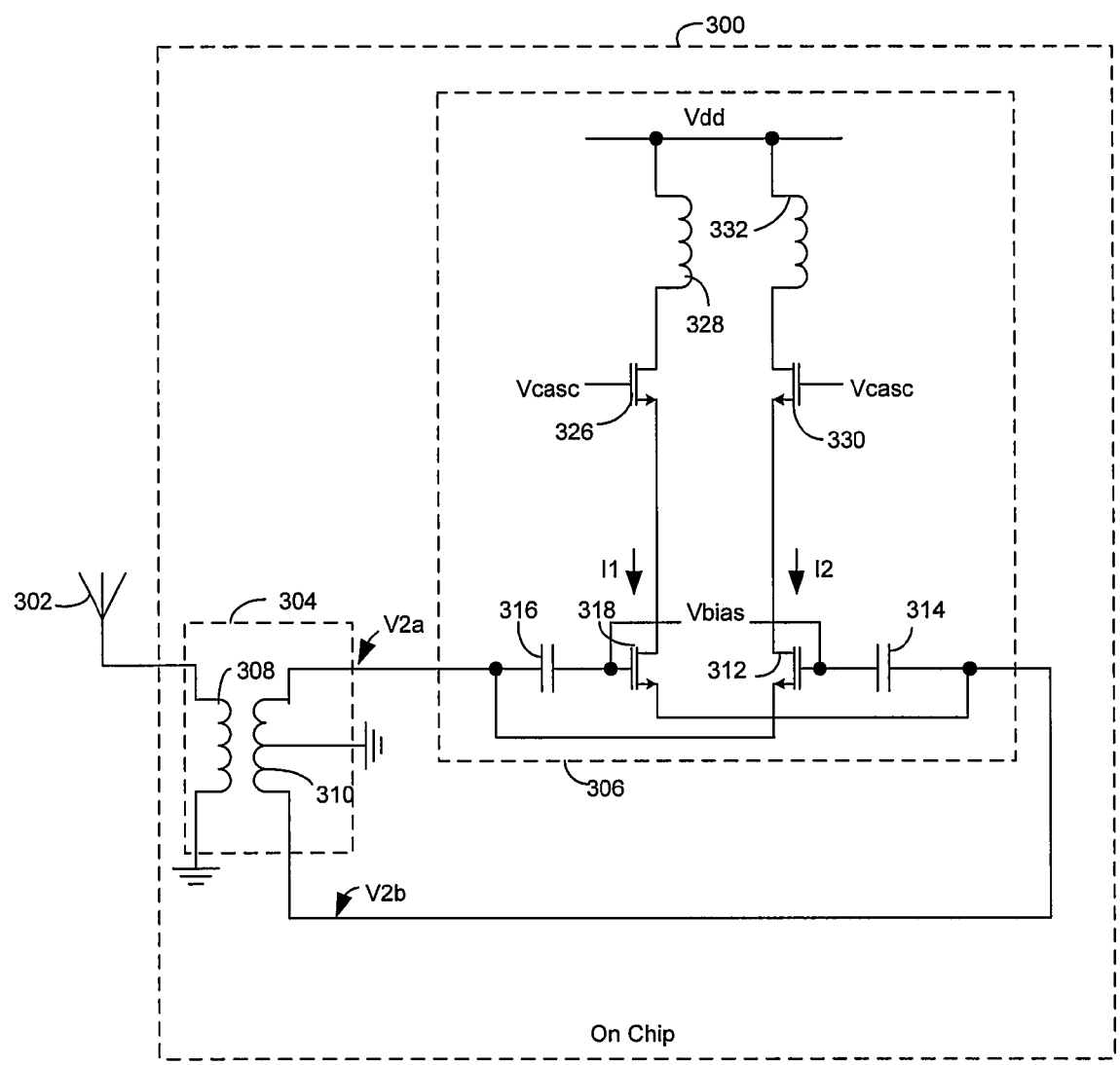
FIG. 3 is a diagram illustrating an exemplary transformer-based cross-coupled high performance low-noise amplifier, in accordance with an embodiment of the invention.

FIG. 3 is a diagram illustrating an exemplary transformer-based cross-coupled high performance low-noise amplifier, in accordance with an embodiment of the invention. Referring to FIG. 3, there is shown an antenna 302, a balun 304 and a low-noise amplifier 306. The balun 304 may comprise inductors 308 and 310. The low noise amplifier may comprise MOSFETs 312, 318, 326 and 330, capacitors 314 and 316, and inductors 328 and 332. There is also shown in FIG. 3, voltages V2a, V2b, Vcasc, Vbias and Vdd, and currents I1 and I2.

In FIG. 3, an exemplary embodiment of the invention is illustrated, where the balun 304 is implemented on the same integrated circuit of the cross-coupled low noise amplifier. Integrating the balun 304 on the same chip with the cross-coupled low-noise amplifier 306 may permit to save substantial die area. Note, in particular, that the amplifier may not need any source inductors, as shown in FIG. 2 with source inductors 222 and 224. The source inductors may be redundant since the inductor 310 of the balun 304 may provide the DC path for the DC components of currents I1 and I2. Furthermore, two capacitors, capacitors 220 and 225 illustrated in FIG. 2, may no longer be required. Capacitors 314 and 316 may be used to block DC signals. Also, a single-ended input terminal to the chip may be required to connect antenna 302, whereas two input terminals are required for the differential inputs to the LNA 206 in the exemplary circuit illustrated in FIG. 2. Vbias may be used to set the bias voltage for MOSFETs 312 and 318, thereby setting the DC operating point. Furthermore, the gates of MOSFETs 326 and 330 are biased by Vcasc. Prior art low-noise amplifier 206 illustrated in FIG. 2, tie the gates of the cascade MOSFETs 226 and 230 to the supply voltage Vdd. Careful choice of Vcasc may improve the performance of low-noise amplifier 306 with respect to tying the gates of MOSFETs 326 and 330 to Vdd.

In accordance with various embodiments of the invention, the joint design of the LNA 306 and the balun 304 on a common integrated circuit may permit better matching and higher performance, as well as better die layout. Most importantly, this may reduce the number of external baluns required and may result in significantly lower cost and tighter integration solutions.

In accordance with an embodiment of the invention, a method and system for a transformer-based high performance cross-coupled low noise amplifier may comprise amplifying a received signal within a single chip 300, comprising an integrated balun 304 and an integrated low-noise amplifier 306, as illustrated in FIG. 3. There is shown in FIG. 3, that the proposed architecture provides a DC current path for the biasing DC components of I1 and I2 through the MOSFETs 312 and 318 and the inductor 310, where the inductor 310 may be grounded at the center tap.

The input stage of the low-noise amplifier 306 illustrated in FIG. 3 may be configured in a cross-coupled configuration or arrangement. The low-noise amplifier 306 may be connected directly to the balun, avoiding the usage of capacitors 220 and 225 that may be required in a discrete implementation as shown in FIG. 2. The elimination of the capacitors 220 and 225 results in a reduction in required chip area and manufacturing cost.

The balun 304 shown in FIG. 3 may comprise two or more inductors. The inductor 310 may be implemented with its center tap connected to ground or through the combination of two inductors in series. The one or more inductors 310 illustrated in FIG. 3, may provide an electrical path for allowing a DC bias current to flow to ground from the low-noise amplifier 306. Integrating the balun with the low-noise amplifier on a single chip as shown in FIG. 3, may permit a single received signal input terminal. The biasing voltage Vbias illustrated in FIG. 3, may be selected to optimize performance of the low-noise amplifier by biasing the cascade MOSFETs 312 and 318.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for processing signals within a communication system, the method comprising:

amplifying a received signal within a single chip, which comprises an integrated balun and a differential input low-noise amplifier; wherein said integrated balun provides a DC bias path for said differential input low-noise amplifier.

2. The method according to claim 1, wherein said low-noise amplifier is configured as a cross-coupled low-noise amplifier.

3. The method according to claim 2, wherein said balun is directly coupled to said cross-coupled low-noise amplifier.

4. The method according to claim 1, wherein said balun comprises two or more inductors.

5. The method according to claim 4, wherein one or more of said inductors provide an electrical path for allowing a DC bias current to flow to ground.

6. The method according to claim 1, wherein said single chip comprises a single received signal input terminal.

7. The method according to claim 1, comprising selecting a biasing voltage to optimize performance of said low-noise amplifier.

8. A system for a communications receiver circuit, the system comprising:

one or more circuits integrated within a single chip, said one or more circuits comprising an integrated balun with a differential input low-noise amplifier;

wherein said integrated balun provides a DC bias path for said differential input low-noise amplifier.

9. The system according to claim 8, wherein said low-noise amplifier is configured as a cross-coupled low-noise amplifier.

10. The system according to claim 9, wherein said balun is directly coupled to said cross-coupled low-noise amplifier.

11. The system according to claim 8, wherein said balun comprises two or more inductors.

12. The system according to claim 11, wherein one or more of said inductors provide an electrical path for allowing a DC bias current to flow to ground.

13. The system according to claim 8, wherein said single chip comprises a single received signal input terminal.

14. The system according to claim 8, wherein said one or more circuits selects a biasing voltage to optimize performance of said low-noise amplifier.

15. A system for processing communication signals, the system comprising:

a single chip comprising an integrated balun and a differential input low-noise amplifier that amplifies a received signal; wherein said integrated balun provides a DC bias path for said differential input low-noise amplifier.

16. The system according to claim 15, wherein said low-noise amplifier is configured as a cross-coupled low-noise amplifier.

17. The system according to claim 16, wherein said balun is directly coupled to said cross-coupled low-noise amplifier.

18. The system according to claim 15, wherein said balun comprises two or more inductors.

19. The system according to claim 18, wherein one or more of said inductors provide an electrical path for allowing a DC bias current to flow to ground.

20. The system according to claim 15, wherein said single chip comprises a single received signal input terminal.

21. The system according to claim 15, comprising one or more circuits that select a biasing voltage to optimize performance of said low-noise amplifier.

* * * * *